United States Patent
Schmidt et al.

(10) Patent No.: US 8,225,509 B2
(45) Date of Patent: Jul. 24, 2012

(54) METHOD FOR MAKING A PIVOT ARM ASSEMBLY FOR SEMICONDUCTOR WAFER HANDLING ROBOTS

(75) Inventors: William Daniel Schmidt, Muskegon, MI (US); Scott A. Hansen, Muskegon, MI (US); Gregory A. Clary, Mocksville, NC (US); David S. Dailey, Clemmons, NC (US)

(73) Assignee: Kaydon Corporation, Muskegon, MI (US)

( * ) Notice: Subject to any disclaimer, the term of this patent is extended or adjusted under 35 U.S.C. 154(b) by 1231 days.

(21) Appl. No.: 12/008,439

(22) Filed: Jan. 11, 2008

(65) Prior Publication Data

US 2009/0180855 A1  Jul. 16, 2009

(51) Int. Cl.
*B21D 53/10* (2006.01)
*B21K 1/04* (2006.01)

(52) U.S. Cl. ........... 29/898.07; 29/898.063; 29/898.066; 29/898.09; 384/510

(58) Field of Classification Search .............. 29/898.06, 29/898.061, 898.062, 898.063, 898.066, 29/898.07, 898.09, 898.14, 592; 74/490.01
See application file for complete search history.

(56) References Cited

U.S. PATENT DOCUMENTS

| | | | |
|---|---|---|---|
| 4,648,729 A | 3/1987 | Jones | |
| 6,099,238 A * | 8/2000 | Tsubota | 414/744.5 |
| 6,222,337 B1 * | 4/2001 | Kroeker et al. | 318/568.11 |
| 6,546,307 B1 * | 4/2003 | Hsiao | 700/121 |
| 6,817,640 B2 | 11/2004 | Menon et al. | |
| 6,896,416 B2 | 5/2005 | Matsuzaki | |
| 2002/0182036 A1 | 12/2002 | Lowrance | |
| 2006/0219042 A1 * | 10/2006 | Tu et al. | 74/490.01 |

FOREIGN PATENT DOCUMENTS

| | | |
|---|---|---|
| KR | 100215174 B1 | 5/1999 |
| KR | 20-0312319 | 5/2003 |
| KR | 1020030072870 A | 9/2003 |

* cited by examiner

*Primary Examiner* — Sarang Afzali
(74) *Attorney, Agent, or Firm* — Price Heneveld LLP

(57) ABSTRACT

A method for making a robot pivot arm assembly includes forming from a rigid, machinable material a circular disk, and forming a circular aperture through the center of the disk. An outer bearing track is formed integrally in the inside surface which defines the aperture, and the apertured disk is positioned in a machining device with a fixturing portion that engages the outer bearing track. An integral outer race, an arm and a gear segment with teeth are then machined into the disk to form the outer portion of the pivot arm assembly. An inner race with an inner bearing track is positioned inside the integral outer race, and rolling bearing elements are inserted into the first and second bearing tracks.

21 Claims, 9 Drawing Sheets

METHOD FOR MAKING A PIVOT ARM ASSEMBLY FOR SEMICONDUCTOR WAFER HANDLING ROBOTS

BACKGROUND OF THE INVENTION

The present invention relates to semiconductor wafer handling robots and the like, and in particular to a pivot arm assembly therefor having an integrally formed bearing construction, as well as a method for making the pivot arm assembly.

Semiconductor wafers are typically made from silicon and are used in semiconductor chips and integrated circuit fabrication. Because of the fragile nature of the silicon-based material, and very small thickness of each slice, the wafers can easily be damaged through mishandling. Modern semiconductor processing systems must handle the wafers quickly and accurately in a very sterile environment to prevent contamination or damage to the processed semiconductor wafers and/or assembled chips.

Robots for handling semiconductor wafers and the like are generally well known in the art. Wafer handling robots, such as those disclosed in U.S. Pat. No. 6,817,640 and 2002/0182036 to Applied Materials, Inc., typically include at least one pair of wafer robot pivots or pivot arms which extend and retract a robot wrist or other similar articulated portion of the robot. As illustrated in FIG. 5A of U.S. Pat. No. 6,817,640 and FIG. 5 of Patent Publication 2002/0182036, each of the pivot arms typically includes an outwardly extending arm adapted for connection with a robot articulation member, as well as a gear segment with teeth which mesh with a robot drive mechanism.

As illustrated in FIG. 1 herein, heretofore, robot pivot arms have typically been fabricated from a plate of metal with a pair of circular recesses formed in opposite faces of one end of the plate in which two ball bearings are mounted. In the example shown in FIG. 1 of the present application, two angular contact ball bearings are mounted in the arm recesses in an angular contact, back-to-back relationship, with the contact angles oriented in opposite directions, so as to support thrust loads and/or clamping forces applied to either side of the bearing assembly. While the dual bearing configuration illustrated in FIG. 1 herein has served to maintain precise orientation, alignment and rotation of the pivot arm, certain drawbacks have been experienced. More specifically, it has been discovered that such bearing mounting arrangements experience infinitesimal small rubbing movement or fretting between the outer races of the bearings and the housing arm recesses, which results in the production of very fine metallic particles or debris that migrates throughout the robot machine thereby causing damage to the moving parts, as well as contaminating the wafers and/or semiconductor chips. In the event the two ball bearings shown in the prior design of FIG. 1 herein are inadvertently installed backwards or otherwise improperly, even more sever fretting results, which destroys the sterile environment in which semiconductor wafers must be handled.

SUMMARY OF THE INVENTION

One aspect of the present invention is a method for making a pivot arm assembly for semiconductor wafer handling robots and the like, comprising forming from a rigid, machinable material a circular disk having a predetermined center, forming a circular aperture through the center of the disk to define an outer integral race portion of the pivot arm assembly having a cylindrically-shaped inside surface, and forming a radially inwardly opening groove in the inside surface of the outer integral race portion to define a first bearing track. The method also includes providing a machining apparatus having a fixturing portion which precisely retains a workpiece relative to a machining portion of the machining apparatus, and positioning the apertured disk in the machining apparatus with the fixturing portion thereof engaging the first bearing track to removably, yet precisely, retain the apertured disk at a predetermined position and orientation relative to the machining portion of the machining apparatus. The machining portion of the machining apparatus is activated to form in the apertured disk an annularly-shaped ring portion with a cylindrically-shaped outside surface disposed generally concentric with the inside surface of the outer integral race portion, an arm portion extending radially outwardly from the ring portion and adapted for connection with a robot articulation member, a gear segment extending radially outwardly from the ring portion in a circumferentially spaced apart relationship with the arm portion, and gear teeth along an outer end portion of the gear segment portion oriented precisely in a predetermined relationship with the first bearing track and adapted for meshing with an associated robot drive mechanism. The method also includes forming an inner race portion of the pivot arm assembly defined by an inside surface configured to receive and retain a mounting member therein, and a cylindrically-shaped outside surface, and forming a radially outwardly opening groove in the outside surface of the inner race portion to define a second bearing track which is shaped substantially similar to the first bearing track in the outer integral race portion. The method also includes positioning the inner race portion inside the inside surface of the outer integral race portion such that the first and second bearing tracks are radially aligned, and the inner race portion is in an eccentric relationship with the outer integral race portion to define between the inside surface of the outer integral race portion and the outside surface of the inner race portion an eccentric gap having a wider portion and a narrower portion. A plurality of rolling bearing elements are sequentially inserted through the gap at the wider portion thereof and into the first and second bearing tracks. The bearing elements are then positioned in a regularly shaped apart relationship about the first and second bearing tracks, and the inner race portion and outer integral race portions are contemporaneously shifted into a concentric relationship. The bearing elements are then retained in the regularly spaced apart relationship in the first and second bearing tracks.

Another aspect of the present invention is an improved method for making a pivot arm assembly for semiconductor wafer handling robots and the like, comprising the steps of forming from a rigid, machinable material a circular disk having a predetermined center, forming a circular aperture through the center of the disk to define an outer integral race portion of the pivot arm assembly having a cylindrically-shaped inside surface, and forming a radially inwardly opening groove in the inside surface of the outer integral race portion to define a first bearing track. The method also includes providing a machining apparatus having a fixturing portion which precisely retains a workpiece relative to a machining portion of the machining apparatus, and positioning the apertured disk in the machining apparatus with the fixturing portion thereof engaging the first bearing track to removably, yet precisely, retain the apertured disk at a predetermined position and orientation relative to the machining portion of the machining apparatus. The method further includes activating the machining portion of the machining apparatus to form in the apertured disk a ring portion disposed generally concentric with the outer integral race portion, a gear segment portion extending radially outwardly from the ring portion, and gear teeth along an outer end portion of the gear segment portion oriented precisely in a predetermined relationship with the first bearing track and adapted for meshing with an associated robot drive mechanism. The method further includes forming an inner race portion of the pivot arm assembly defined by an inside surface configured to receive and retain a mounting member therein, and a cylindrically-shaped outside surface, and forming a radially outwardly opening groove in the outside surface of the inner race portion to define a second bearing track which is shaped substantially similar to the first bearing track in the outer integral race portion. The inner race portion is positioned inside the inside surface of the outer integral race portion such that the first and second bearing tracks are radially aligned, and a plurality of rolling bearing elements are inserted into the first and second bearing tracks.

Yet another aspect of the present invention is a robotic machine for handling semiconductor wafers and the like, having an improved pivot arm assembly comprising a rigid, annularly-shaped ring portion having a cylindrically-shaped inside surface and a cylindrically-shaped outside surface, with a radially inwardly opening groove formed in the inside surface of the ring portion to define a first bearing track. The pivot arm assembly also includes a rigid, cylindrically-shaped sleeve portion having a cylindrically-shaped inside surface configured to receive and retain a mounting portion of the robotic machine therein, and a cylindrically-shaped outside surface with a radially outwardly opening groove formed in the outside surface of the sleeve portion to define a second bearing track which is shaped substantially similar to the first bearing track in the ring portion. The sleeve portion is positioned inside the inside surface of the ring portion in an assembly condition, wherein the first and second bearing tracks are radially aligned, and the sleeve portion is in an eccentric relationship with the ring portion to form between the inside surface of the ring portion and the outside surface of the sleeve portion an eccentric gap having a wider portion and a narrower portion. The pivot arm assembly also includes a gear segment portion with teeth formed along one portion thereof, with an opposite portion thereof fixedly connected with the outside surface of the ring portion such that the teeth protrude radially outwardly from the ring portion. The pivot arm assembly also includes a rigid connector arm portion having one end thereof fixedly connected with the outside surface of the ring portion such that the connector arm portion extends radially outwardly from the ring portion in a circumferentially spaced apart relationship with the gear segment portion. A plurality of rolling bearing elements are sequentially inserted through the gap at the wider portion thereof and into the first and second bearing tracks, and subsequently positioned in a regularly spaced apart relationship around the first and second bearing tracks with the sleeve portion and the ring portion being contemporaneously shifted into a concentric relationship. A separator portion is connected with the bearing elements and pivotally retains the bearing elements in the regularly spaced apart relationship in the first and second bearing tracks.

Another aspect of the present invention provides a pivot arm assembly for semiconductor wafer handling robots and the like that includes an integrally formed thin section bearing to eliminate the fretting associated with prior art bearing arrangements. Preferably, the outside bearing track is formed directly or integrally in the pivot housing, thereby eliminating the separate outer bearing race incorporated into prior art designs, and the associated fretting problems. The pivot arm assembly has a gear segment portion with teeth that are precisely aligned with the bearing tracks so as to accurately locate and rotate the pivot arm assembly during operation. The pivot arm assembly is efficient in use, capable of a long operating life, and particularly well adapted for the proposed use.

These and other advantages of the invention will be further understood and appreciated by those skilled in the art by reference to the following written specification, claims and appended drawings.

DETAILED DESCRIPTION OF THE PREFERRED EMBODIMENTS

Figure 1:
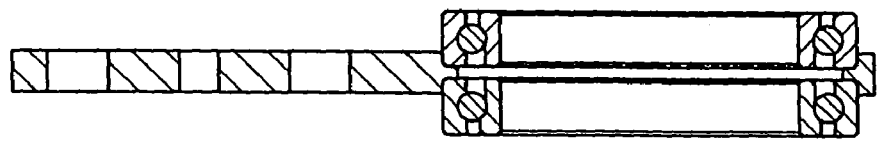
FIG. 1 is a cross-sectional view of a prior art pivot arm for semiconductor wafer handling robots.
Figure 2:
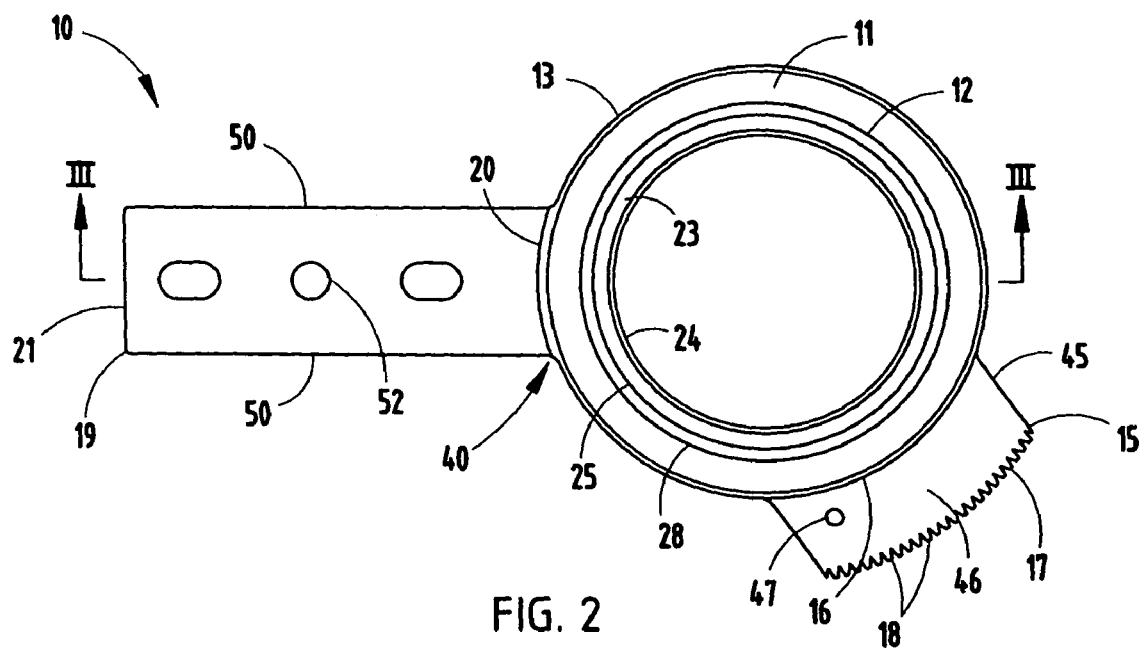
FIG. 2 is a plan view of a pivot arm assembly embodying the present invention.

For purposes of description herein, the terms "upper", "lower", "right", "left", "rear", "front", "vertical", "horizontal" and derivatives thereof shall relate to the invention as oriented in FIGS. 1 and 2. However, it is to be understood that the invention may assume various alternative orientations and step sequences, except where expressly specified to the contrary. It is also to be understood that the specific devices and processes illustrated in the attached drawings, and described in the following specification, are simply exemplary embodiments of the inventive concepts defined in the appended claims. Hence, specific dimensions and other physical characteristics relating to the embodiments disclosed herein are not to be considered as limiting, unless the claims expressly state otherwise.

Figure 3:
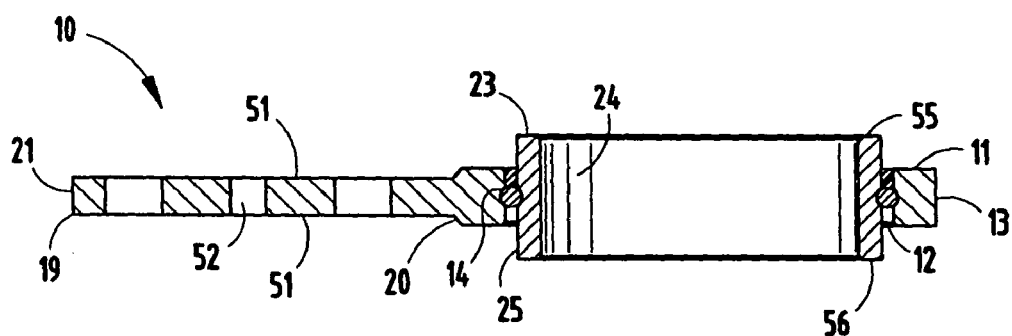
FIG. 3 is a cross-sectional view of the pivot arm assembly, taken along the line III-III, FIG. 2.
Figure 22:
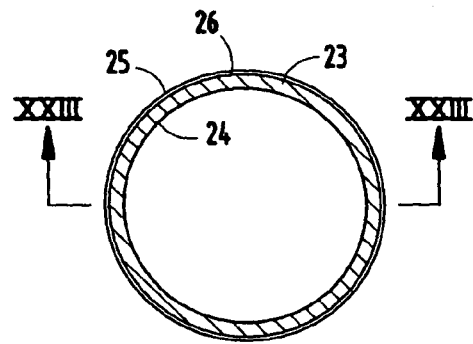
FIG. 22 is a cross-sectional view of the sleeve shown after a bearing track has been formed in the outer surface thereof.
Figure 21:
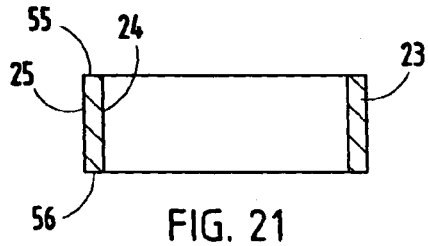
FIG. 21 is a cross-sectional view of the sleeve taken along the line XXI-XXI, FIG. 20.
Figure 23:
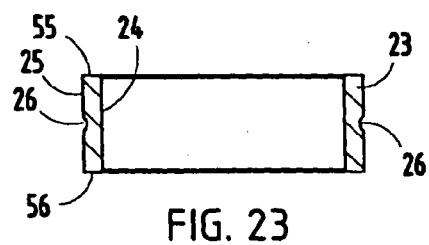
FIG. 23 is a cross-sectional view of the groove sleeve taken along the line XXIII-XXIII, FIG. 22.
Figure 27:
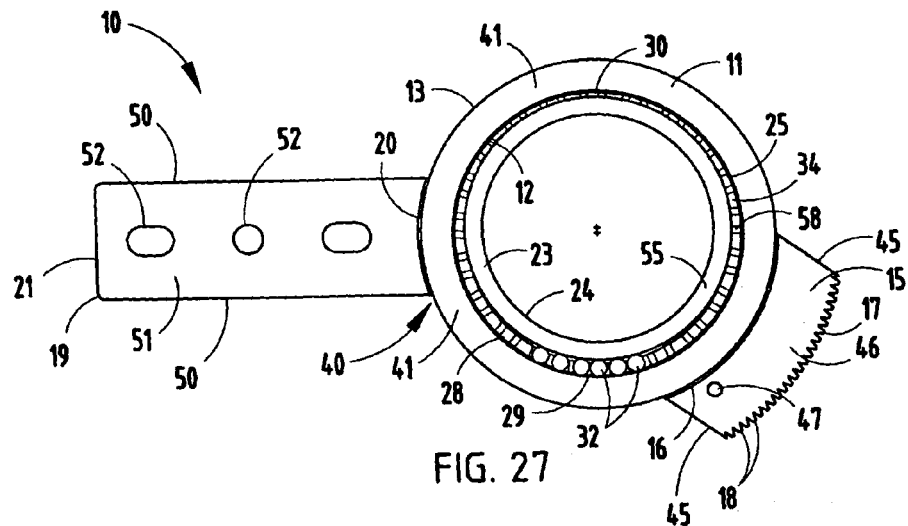
FIG. 27 is a plan view of the pivot arm assembly shown during assembly, wherein the sleeve is positioned in an eccentric relationship relative to the ring portion of the pivot arm assembly.
Figure 28:
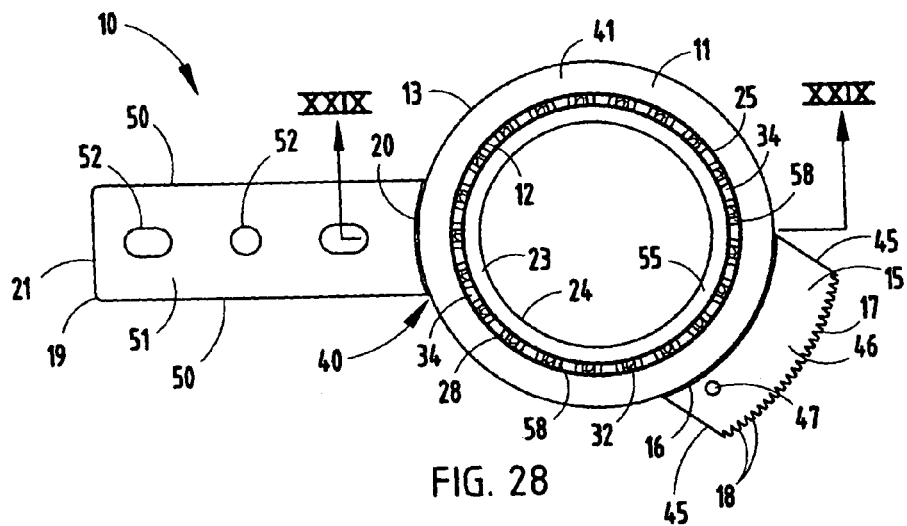
FIG. 28 is a plan view of the pivot arm assembly after the bearing elements have been inserted into the bearing tracks and the sleeve shifted to a concentric relationship with the ring member.
Figure 29:
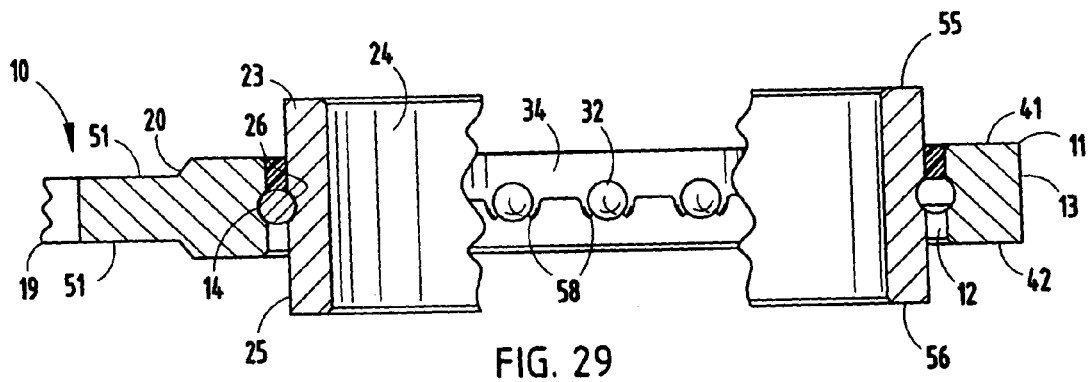
FIG. 29 is a cross-sectional view of the pivot arm assembly taken along the line XXIX-XXIX, FIG. 28.

The reference numeral 10 (FIGS. 2 and 3) generally designates a pivot arm assembly for semiconductor wafer handling robots and the like, having an integrally formed bearing construction embodying the present invention. Pivot arm assembly 10 includes a rigid, annularly-shaped housing or ring portion 11, which as best illustrated in FIGS. 16-19 includes a cylindrically-shaped inside surface 12 and a cylindrically-shaped outside surface 13, with a radially inwardly opening groove 14 formed in the inside surface 12 of ring portion 11 to define a first bearing track. Pivot arm assembly 10 also includes a gear segment portion 15 having an interior edge 16 fixedly connected with the outside surface 13 of ring portion 11 and an exterior edge 17 with gear teeth 18 that protrude radially outwardly from the ring portion 11. Pivot arm assembly 10 also includes a rigid connector arm portion 19 having an interior end 20 fixedly connected with the outside surface 13 of ring portion 11, and extending radially outwardly from the ring portion 11 in a circumferentially spaced apart relationship with gear segment portion 15. Pivot arm assembly 10 also includes a rigid, cylindrically-shaped sleeve portion 23, which as best illustrated in FIGS. 22 and 23, has a cylindrically-shaped inside surface 24 configured to receive and retain a mounting portion of the robotic machine therein (not shown), and a cylindrically-shaped outside surface 25 with a radially outwardly opening groove 26 formed in the outside surface 25 of sleeve portion 23 to define a second bearing track which is shaped substantially similar to the first bearing track 14 in ring portion 11. As best illustrated in FIGS. 27-29, sleeve portion 23 is positioned inside the inside surface 12 of ring portion 11 in an assembly condition, wherein the first and second bearing tracks 14 and 26 are radially aligned, and sleeve portion 23 is in an eccentric relationship with ring portion 11 to form between the inside surface 12 of ring portion 11 and the outside surface 25 of sleeve portion 23 an eccentric gap 28 (FIG. 27) having a wider portion 29 and a narrower portion 30. A plurality of rolling bearing elements 32 are sequentially inserted through gap 28 at the wider portion 29 thereof and into the first and second bearing tracks 14 and 26 and subsequently positioned in a regularly spaced apart relationship around the first and second bearing tracks 14 and 26 with the sleeve portion 23 and ring portion 11 being contemporaneously shifted into the concentric relationship illustrated in FIG. 28. A separator 34 may be connected with bearing elements 32, so as to pivotally retain the bearing elements 32 in their regularly spaced apart relationship in the first and second bearing tracks 14 and 26.

In the illustrated example, pivot arm assembly 10 (FIGS. 16-19) has a one-piece, integrally formed outer portion 40 comprising a housing or ring portion 11, a gear segment portion 15 and a connector arm portion 19. Ring portion 11 defines an outer integral race portion of the pivot arm assembly 10, and in the illustrated example, has a substantially annular shape defined by cylindrical inside surface 12, cylindrical outside surface 13 and a pair of flat, oppositely disposed side faces 41 and 42. The groove 14 or outer bearing track formed in the inside surface 12 of ring portion 11 has an arcuate shape and is disposed centrally along the inside surface 12 of ring portion 11. In the example illustrated in FIG. 17, bearing track 14 has a circular segment shape configured to retain spherical ball bearing elements 32 in a four point contact relationship, as explained in greater detail hereinafter.

The illustrated gear segment portion 15 is formed integral with ring portion 11 and protrudes radially outwardly from the outside surface 13 thereof. Gear segment portion 15 has a generally arcuate plan configuration defined by arcuate interior and exterior edges 16 and 17, straight radially extending side edges 45 and flat opposing faces 46. The illustrated gear segment portion 15 includes an aperture 47 which extends through the faces 46 adjacent side edges 45 and is adapted to retain a stop pin or the like (not shown) therein.

The illustrated connector arm portion 19 has a generally rectangular plan configuration defined by an arcuately-shaped interior edge 20, a straight exterior edge 21, opposite side edges 50 and flat opposing faces 51. Connector arm portion 19 extends radially outwardly from the outside surface 13 of ring portion 11 in a circumferentially spaced apart relationship with gear segment portion 15, which in the illustrated example is approximately 120 degrees. In the example illustrated in FIGS. 16 and 17, connector arm portion 19 includes a plurality of apertures 52 through faces 51 which serve to connect the same with an associated portion of the robotics machine.

The illustrated sleeve portion 23 (FIGS. 20-23) has an annular shape defined by cylindrical inside surface 24, cylindrical outside surface 25 and a pair of flat opposing side faces 55 and 56. The groove 26 or inner bearing track has a generally arcuate shape that is disposed centrally along the outside surface 25 of sleeve portion 23. In the illustrated example, bearing track 26 has a circular segment shape similar to that of outer bearing track 14, and is designed to mate with associated spherical ball bearing elements 32 in a four point contact relationship, as described in detail hereinafter.

Figure 24:
FIG. 24 is an enlarged perspective view of a rolling bearing element.

The illustrated bearing elements 32 (FIG. 24) are spherically-shaped ball bearing elements, and may be constructed from a wide variety of materials, including ceramic materials and the like.

Figure 25:
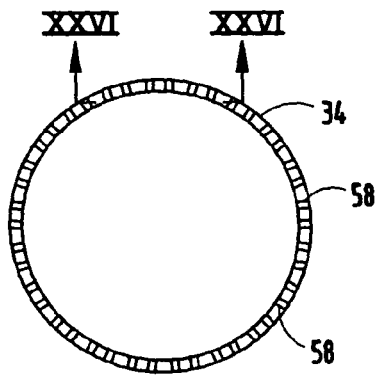
FIG. 25 is a plan view of an interior side of a bearing element separator.
Figure 26:
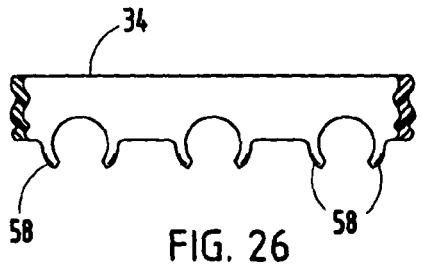
FIG. 26 is a fragmentary side elevational view of the bearing element separator.

The illustrated separator 34 (FIGS. 25 and 26) has a generally annular shape which is sized to fit within the gap 28 between the outer surface 25 of sleeve portion 23 and inner surface 12 of ring portion 11 in the installed condition. The interior face of separator 34 includes a plurality of axially inwardly facing pairs of teeth 58 which are configured to snap over the exterior surface of the ball bearing elements 32 and pivotally retain the ball bearing elements 32 in a regularly spaced apart pattern in bearing tracks 14 and 26, as illustrated in FIGS. 28 and 29.

Figure 7:
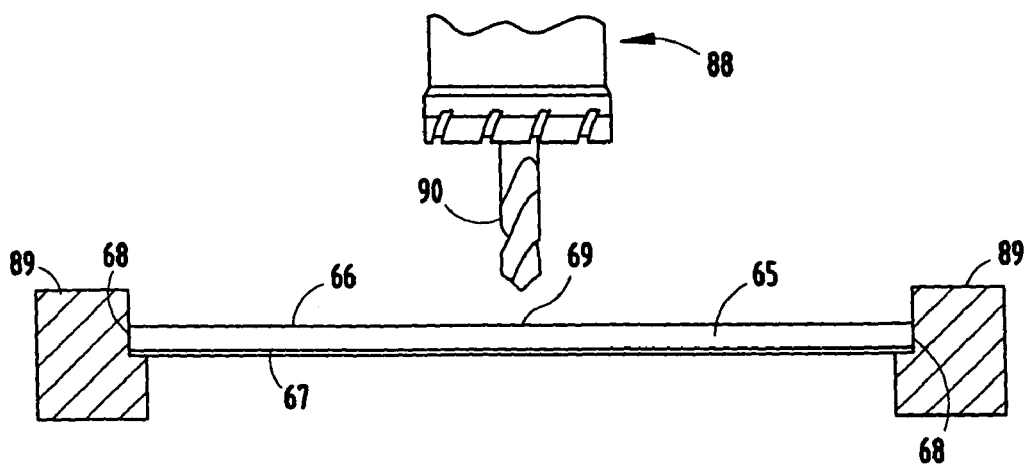
FIG. 7 is a partially schematic view of a manufacturing step for forming an aperture through the center of the disk.
Figure 8:
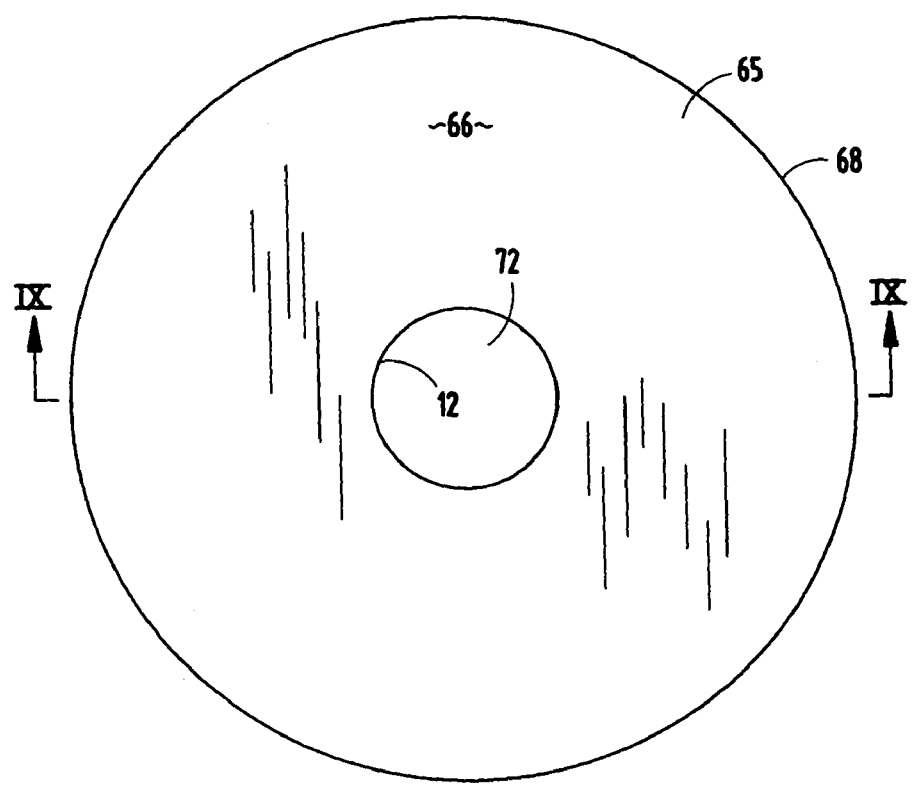
FIG. 8 is a plan view of the disk with the aperture formed therein.
Figure 9:
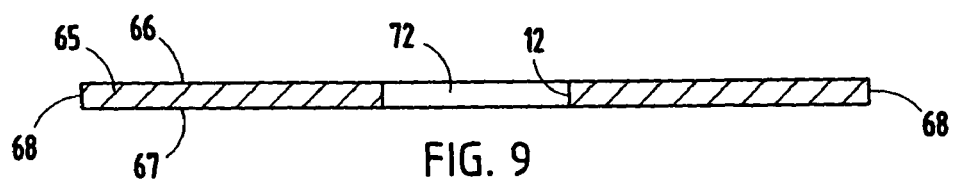
FIG. 9 is a cross-sectional view of the disk taken along the line IX-IX, FIG. 8.
Figure 10:
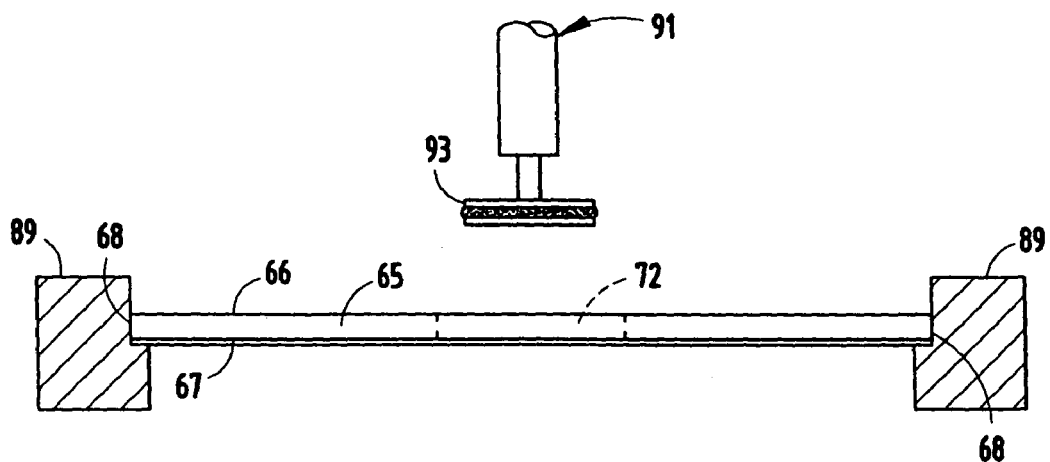
FIG. 10 is a partially schematic view of a manufacturing step for forming a bearing track in the inside surface of the apertured disk.
Figure 11:
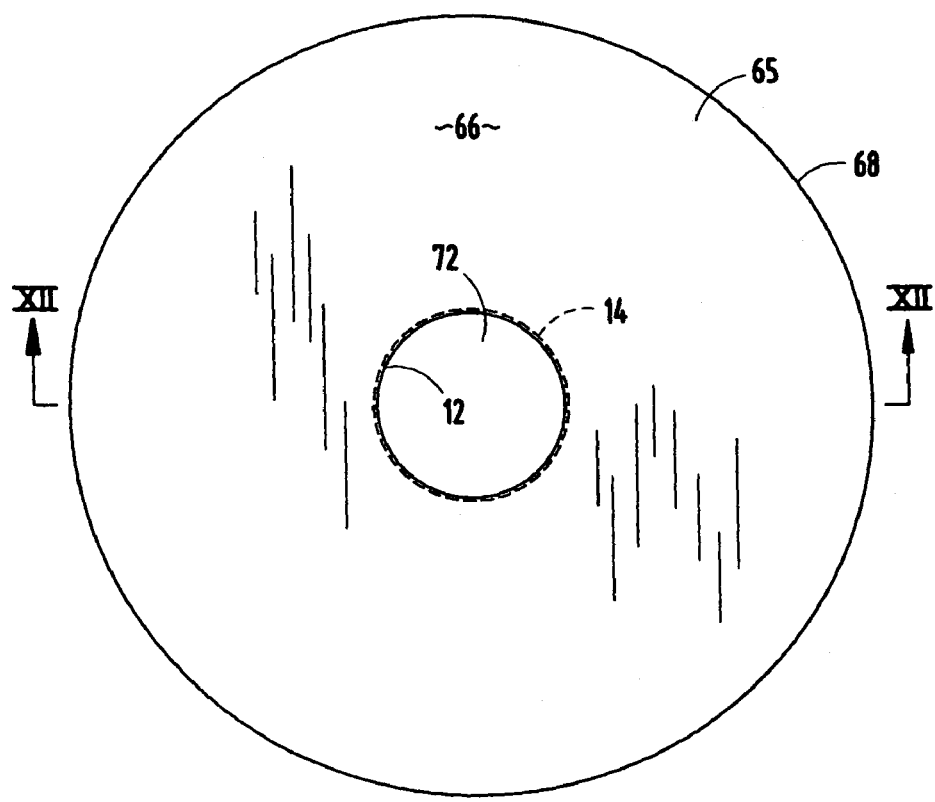
FIG. 11 is a plan view of the apertured disk with the bearing track formed therein.
Figure 12:
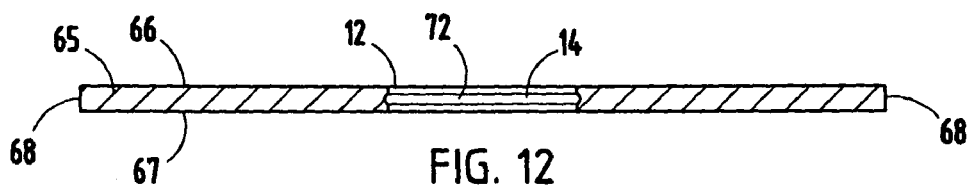
FIG. 12 is a cross-sectional view of the apertured disk taken along the line XII-XII, FIG. 11.
Figure 13:
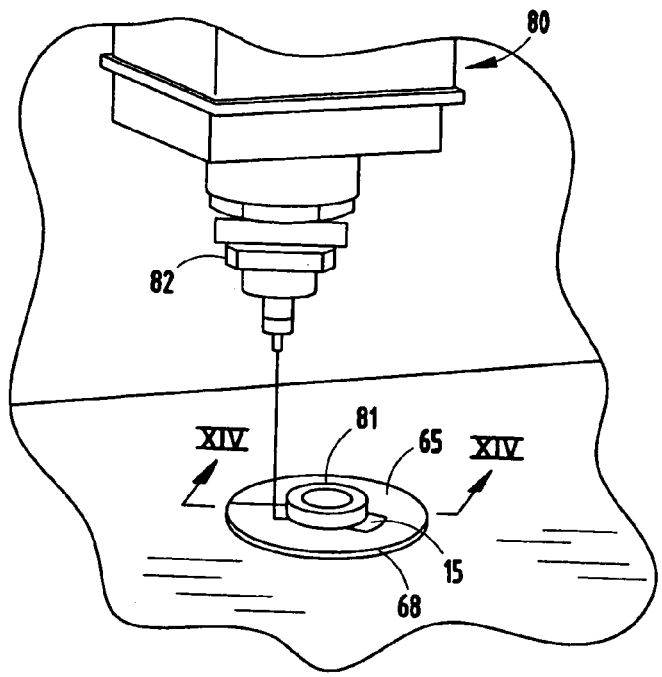
FIG. 13 is a partially schematic perspective view of a machining apparatus in which the apertured disk has been fixtured for machining.
Figure 14:
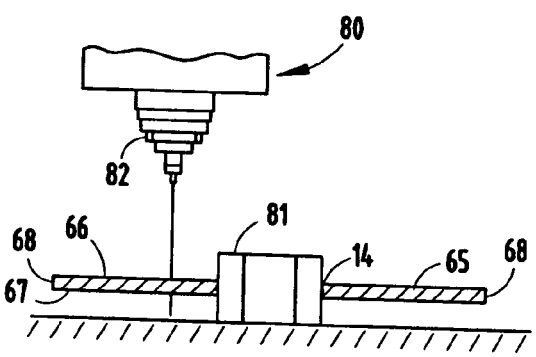
FIG. 14 is a partially schematic side view of the fixtured disk being machined.
Figure 15:
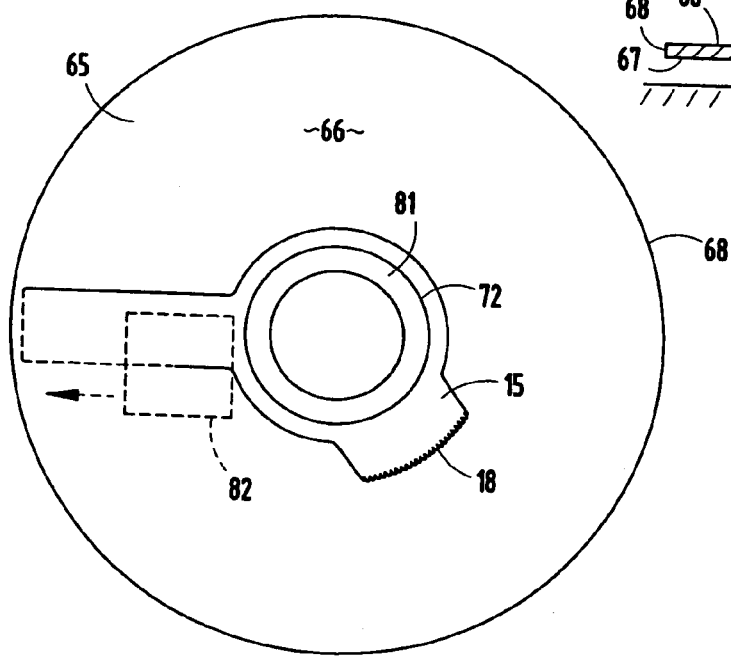
FIG. 15 is a partially schematic plan view of the fixtured disk being machined to form the outer portion of the pivot arm assembly.
Figure 16:
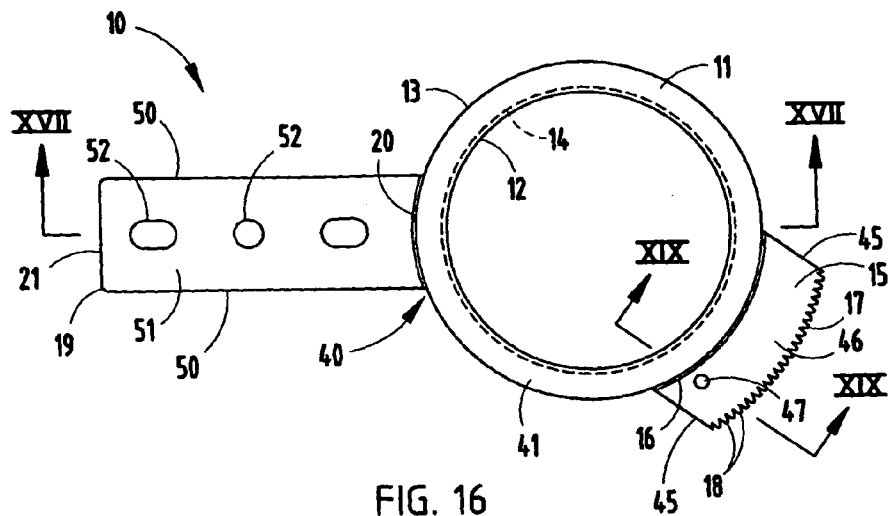
FIG. 16 is a plan view of the finished outer portion of the pivot arm assembly before assembly of the inner race.
Figure 17:
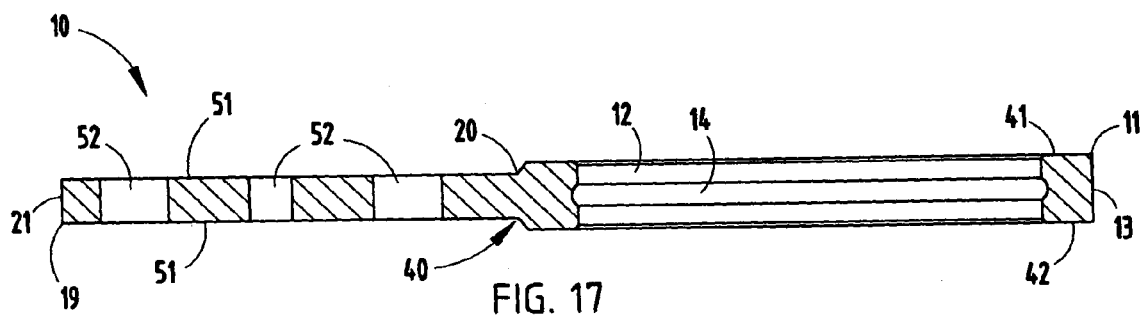
FIG. 17 is a cross-sectional view of the finished outer portion of the pivot arm assembly taken along the line XVII-XVII, FIG. 16.
Figure 18:
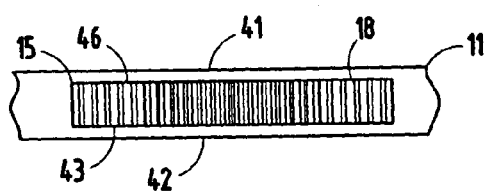
FIG. 18 is a side elevational view of the gear segment.
Figure 19:
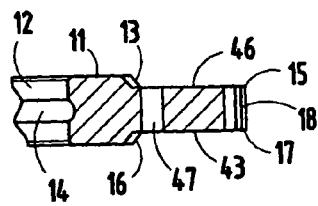
FIG. 19 is a cross-sectional view of the gear segment taken along the line XIX-XIX, FIG. 16.
Figure 20:
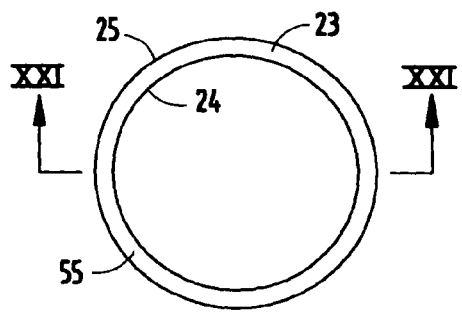
FIG. 20 is a plan view of a sleeve portion of the pivot arm assembly shown before formation of an associated bearing track.

As best illustrated in FIGS. 4-23, the present invention also contemplates a unique method for making pivot arm assembly 10, which includes forming from a rigid, machinable material a circular disk 65 defined by a pair of parallel, circularly-shaped faces 66 and 67, a cylindrically-shaped outer edge 68, and a center 69. As shown in FIGS. 7-9, a circular aperture 72 is formed through the center 69 of the disk 65 to define the inside surface 12 of ring portion 11. As best illustrated in FIGS. 10-12, the radially inwardly opening groove 14 which defines the outside bearing track is then formed in the inside surface 12 of the apertured disk 65. With reference to FIGS. 13-15, the apertured disk 65, with outer bearing track 14 formed therein, is then processed in a machining apparatus 80 which has a fixturing portion 81 that precisely retains a workpiece relative to a machining portion 82 of apparatus 80. More specifically, the apertured disk 65 is positioned in the machining apparatus 80 with the fixturing portion 81 engaging the outer bearing track 14 to removably, yet precisely, retain the apertured disk 65 at a predetermined position and orientation relative to the machining portion 82 of the machining apparatus 80. The machining portion 82 of the machining apparatus 80 is then activated to form in the apertured disk 65 the annularly-shaped housing or ring portion 11 of pivot arm assembly 10, the connector arm portion 19, the gear segment portion 15 and the gear teeth 18. Because the fixturing portion 81 engages the previously formed outside bearing track 14, the gear teeth 18 on gear segment portion 15, as well as the gear segment portion and the connector arm portion 19, are precisely located relative to the outer bearing track 14. The sleeve portion 23, which may be fabricated using conventional techniques, is positioned inside the inside surface 12 of the ring portion 11, as shown in FIG. 27, such that the inside and outside bearing tracks 26 and 14 are radially aligned, and the sleeve portion 23 and ring portion 11 are in an eccentric relationship to form between the inside surface 12 of the ring portion 11 and the outside surface 25 of the sleeve portion 23 the eccentric gap 28, which has wider portion 29 and narrower portion 30 arranged in diametrically opposite sides of the pivot arm assembly. The bearing elements 32 are sequentially inserted through the gap 28 at the wider portion 29 thereof and into the inner and outer bearing tracks 26 and 14. The bearing elements 32 are then positioned in a regularly spaced apart relationship around the inner and outer bearing tracks 26 and 14, and the sleeve portion 23 and ring portion 11 are contemporaneously shifted into a concentric relationship, as shown in FIG. 28. The bearing elements 32 are then retained in their regularly spaced apart relationship around the inner and outer bearing tracks 26 and 14 by means such as the illustrated separator 34, or by using other known techniques.

Figure 4:
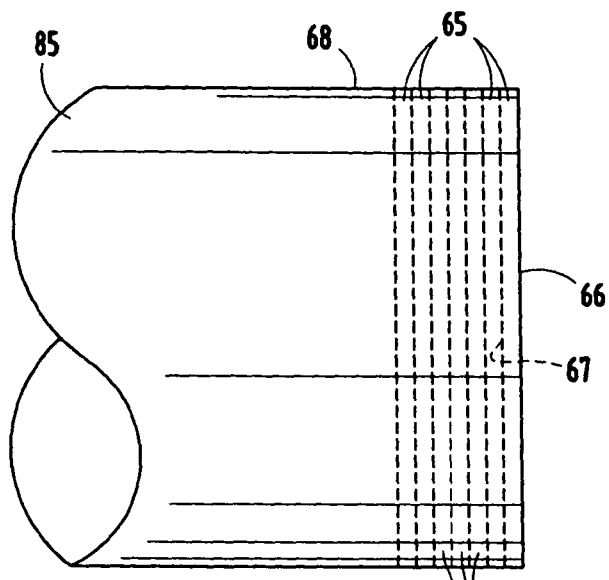
FIG. 4 is partially diagrammatic view of a solid rod that is cut lengthwise into disks from which the pivot arm assembly is constructed.
Figure 5:
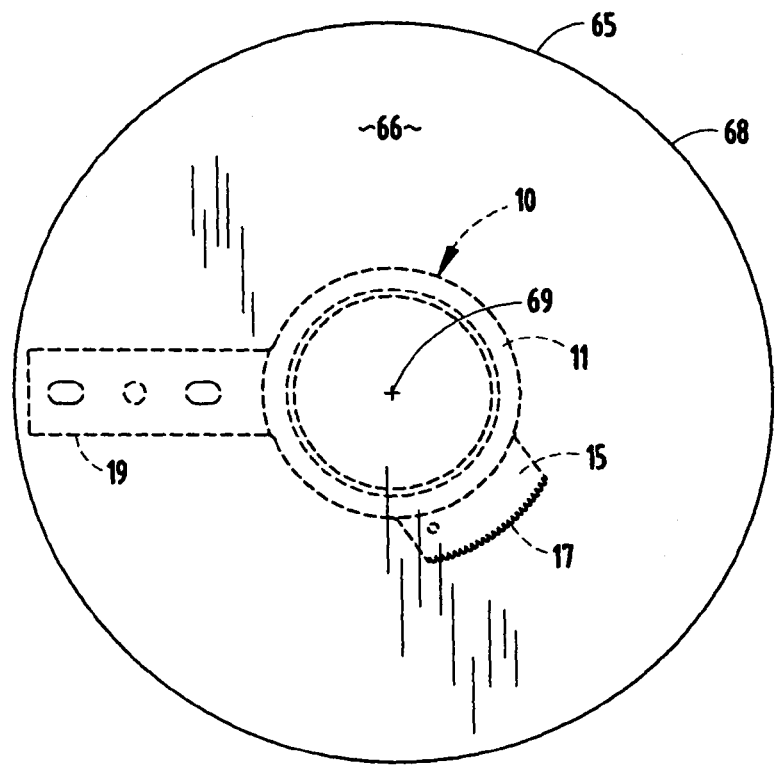
FIG. 5 is a plan view of one of the disks cut from the rod with an outer portion of the pivot arm assembly shown in broken lines.
Figure 6:
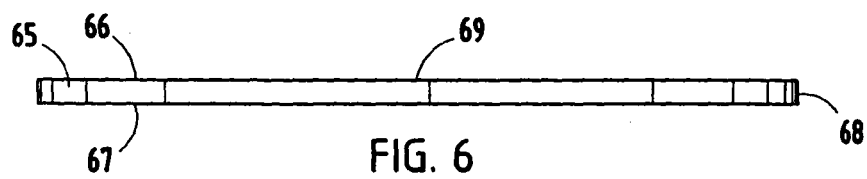
FIG. 6 is an edge view of the disk.

In the example illustrated in FIGS. 4-6, each disk 65 is cut from a solid cylindrical bar or rod 85 of 440 stainless steel or other similar material. As best illustrated in FIG. 5, the diameter of disk 65 is selected to be equal to or slightly greater than the longest dimension of pivot arm assembly 10 from its center point, which in the illustrated example is the distance between the center of ring portion 11 and the outer end 21 of connector arm portion 19, such that the entire outer portion 40 of pivot arm assembly 10 can be formed integrally and in one piece from disk 65.

In the example illustrated in FIGS. 7-9, the solid disk 65 is positioned in a drilling apparatus 88 which has a fixturing portion 89 that engages the outer edge 68 of disk 65 to precisely locate the solid disk 65 relative to an associated drill bit 90. Aperture 72 is then formed in the solid disk 65 by extending drill bit 90 through the disk.

In the example illustrated in FIGS. 10-12, a grinding head 93 is then shifted into position above the apertured disk 65 while it remains securely retained within the fixturing portion 89 of drilling apparatus 88, or another similar fixturing mechanism that gauges off of the outer edge 68 of disk 65. The interior surface 12 of disk 65 is then ground to the precise size and shape desired. Grinding wheel 93 then grinds to precision into surface 12 the outside bearing track 14, as discussed above. By fixturing disk 65 from the outside edge 68 of the disk 65, and performing the drilling and grinding functions while fixtured in the same position, great accuracy can be achieved.

In the example illustrated in FIGS. 13-15, the apertured disk 65, with outside bearing track 14 formed therein, is then loaded into machining apparatus 80, which in the illustrated example is a wire EDM machine. More specifically, the fixturing portion 81 of the EDM machine 80 engages the previously formed outside bearing track 14 in the apertured disk 65, so as to precisely position and orient the disk 65 relative to the cutting head portion 82 of EDM machine 80. EDM machine 80 is then activated so as to cut from the disk 65 the ring portion 11, the connector arm portion 19, the gear segment portion 15 and the gear teeth 18. Because the disk 65 is fixtured off of the previously formed outside bearing track 14, the orientation of the bearing track relative to the gear teeth 18, as well as the other surfaces of the connector arm portion 19 and gear segment portion 15, is very precise.

In the example illustrated in FIGS. 27-29, after the ball bearing elements 32 have been loaded into the bearing tracks 14 and 26, and the sleeve portion 23 shifted into a concentric relationship with ring portion 11, separator 34 is positioned into gap 28, and is snapped over the outside surfaces of the bearing elements 32 to pivotally retain the ball bearing elements in a regularly spaced apart relationship along the bearing tracks 14 and 26.

Figure 30:
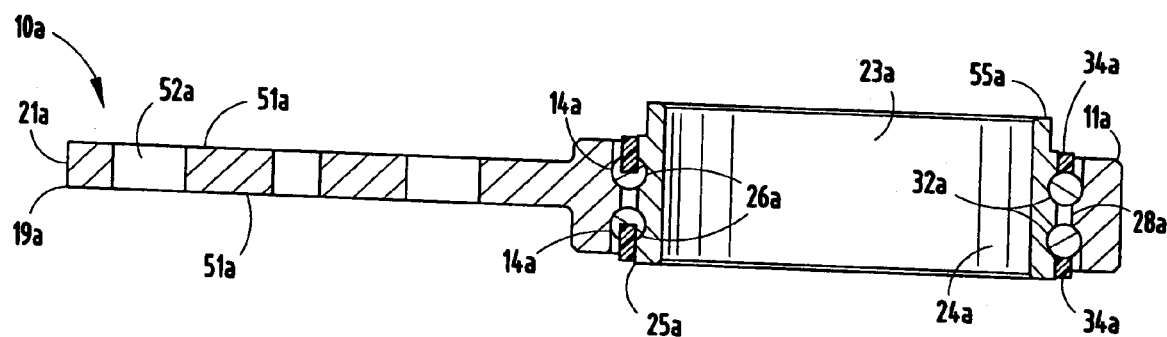
FIG. 30 is a cross-sectional view of an alternative embodiment of the present invention.

The reference numeral 1*a* (FIG. 30) generally designates another embodiment of the present invention having two sets of bearing elements and bearing tracks positioned adjacent opposite sides of the pivot arm assembly. Since pivot arm assembly 10*a* is similar to the previously described pivot arm assembly 10, similar parts appearing in FIGS. 1-29 and FIG. 30, respectively, are represented by the same, corresponding reference numeral, except for the suffix "a" in the numerals of the latter. The pivot arm assembly 10*a* shown in FIG. 30 has a ring portion 11*a*, a gear segment portion (not shown) and a connector arm portion 19*a* similar to pivot arm assembly 10. However, in pivot arm assembly 10*a*, the inside surface 12*a* of ring portion 11*a* and the outside surface 25*a* of sleeve portion 23*a* have two, axially spaced apart bearing tracks 14*a* and 26*a* with two sets of bearing elements 32*a* arranged for angular contact in a back-to-back relationship. Two separators 34*a* are snapped onto the bearing elements 32*a* through opposite sides of the gap 28*a*.

In the foregoing description, it will be readily appreciated by those skilled in the art that modifications may be made to the invention without departing from the concepts disclosed herein. Such modifications are to be considered as included in the following claims, unless these claims by their language expressly state otherwise.

The invention claimed is as follows:

1. A method for making a pivot arm assembly for semiconductor wafer handling robots and the like, comprising:

forming from a rigid, machinable material a circular disk having a predetermined center;

forming a circular aperture through the center of the disk to define an outer integral race portion of the pivot arm assembly having a cylindrically-shaped inside surface;

forming a radially inwardly opening groove in the inside surface of the outer integral race portion to define a first bearing track;

providing a machining apparatus having a fixturing portion which precisely retains a workpiece relative to a machining portion of the machining apparatus;

positioning the apertured disk in the machining apparatus with the fixturing portion thereof engaging the first bearing track to removably, yet precisely, retain the apertured disk at a predetermined position and orientation relative to the machining portion of the machining apparatus;

activating the machining portion of the machining apparatus to form in the apertured disk an annularly-shaped ring portion with a cylindrically-shaped outside surface disposed generally concentric with the inside surface of the outer integral race portion, an arm portion extending radially outwardly from the ring portion and adapted for connection with a robot articulation member, a gear segment portion extending radially outwardly from the ring portion in a circumferentially spaced apart relationship with the arm portion, and gear teeth along an outer end portion of the gear segment portion oriented precisely in a predetermined relationship with the first bearing track and adapted for meshing with an associated robot drive mechanism;

forming an inner race portion of the pivot arm assembly defined by an inside surface configured to receive and retain a mounting member therein, and a cylindrically-shaped outside surface;

forming a radially outwardly opening groove in the outside surface of the inner race portion to define a second bearing track which is shaped substantially similar to the first bearing track in the outer integral race portion;

positioning the inner race portion inside the inside surface of the outer integral race portion such that the first and second bearing tracks are radially aligned, and the inner race portion is in an eccentric relationship with the outer integral race portion to form between the inside surface of the outer integral race portion and the outside surface of the inner race portion an eccentric gap having a wider portion and a narrower portion;

sequentially inserting a plurality of rolling bearing elements through the gap at the wider portion thereof and into the first and second bearing tracks;

positioning the bearing elements in a regularly spaced apart relationship around the first and second bearing tracks and contemporaneously shifting the inner race portion and the outer integral race portion into a concentric relationship; and retaining the bearing elements in the regularly spaced apart relationship in the first and second bearing tracks.

2. The method as set forth in claim 1, wherein:
said aperture forming step includes:
providing a second machining apparatus having a fixturing portion which precisely retains a workpiece relative to a machining portion of the second machining apparatus; and positioning the disk in the second machining apparatus with the fixturing portion thereof engaging the outer circumferential edge of the disk to removably, yet precisely, retain the disk at a predetermined position and orientation relative to the machining portion of the second machining apparatus.

3. The method as set forth in claim 2, wherein:
said disk forming step includes cutting the disk from an elongate, solid rod of steel.

4. The method as set forth in claim 3, wherein:
said aperture forming step further includes drilling the aperture through the center of the disk while the disk is retained in the fixturing portion of the second machining apparatus.

5. The method as set forth in claim 4, wherein:
said aperture forming step further includes grinding the inside surface of the outer integral race portion while the apertured disk is retained in the fixturing portion of the second machining apparatus.

6. The method as set forth in claim 5, wherein:
said first bearing track forming step comprises grinding the radially inwardly opening groove in the inside surface of the outer integral race portion while the apertured disk is retained in the fixturing portion of the second machining apparatus.

7. The method as set forth in claim 6, wherein:
said first bearing track forming step comprises grinding the first bearing track into a configuration which forms a radial contact bearing with the bearing elements.

8. The method as set forth in claim 7, wherein:
said sleeve forming step comprises forming the sleeve from steel; and
said sleeve groove forming step comprises grinding the outside surface of the sleeve to form the second bearing track into a configuration which forms a radial contact bearing with the bearing elements.

9. The method as set forth in claim 8, wherein:
said first and second track forming steps comprise grinding the first and second bearing tracks for four point contact with the bearing elements.

10. The method as set forth in claim 9, wherein:
said bearing element retaining step comprises attaching a separator to the bearing elements after said bearing element positioning step.

11. The method as set forth in claim 10, wherein:
said bearing element inserting step includes selecting ceramic balls for the bearing elements.

12. The method as set forth in claim 11, wherein:
said first named machining apparatus providing step comprises selecting a wire EDM machine.

13. The method as set forth in claim 12, wherein:
said disk forming step further includes selecting an elongate, solid rod of stainless steel.

14. The method as set forth in claim 1, wherein:
said disk forming step includes cutting the disk from an elongate, solid rod of steel; and
said aperture forming step further includes drilling the aperture through the center of the disk.

15. In a method for making a pivot arm assembly for semiconductor wafer handling robots and the like, the improvement comprising:
forming from a rigid, machinable material a circular disk having a predetermined center;

forming a circular aperture through the center of the disk to define an outer integral race portion of the pivot arm assembly having a cylindrically-shaped inside surface;

forming a radially inwardly opening groove in the inside surface of the outer integral race portion to define a first bearing track;

providing a machining apparatus having a fixturing portion which precisely retains a workpiece relative to a machining portion of the machining apparatus;

positioning the apertured disk in the machining apparatus with the fixturing portion thereof engaging the first bearing track to removably, yet precisely, retain the apertured disk at a predetermined position and orientation relative to the machining portion of the machining apparatus;

activating the machining portion of the machining apparatus to form in the apertured disk a ring portion disposed generally concentric with the outer integral race portion, a gear segment portion extending radially outwardly from the ring portion, and gear teeth along an outer end portion of the gear segment portion oriented precisely in a predetermined relationship with the first bearing track and adapted for meshing with an associated robot drive mechanism;

forming an inner race portion of the pivot arm assembly defined by an inside surface configured to receive and retain a mounting member therein, and a cylindrically-shaped outside surface;

forming a radially outwardly opening groove in the outside surface of the inner race portion to define a second bearing track which is shaped substantially similar to the first bearing track in the outer integral race portion;

positioning the inner race portion inside the inside surface of the outer integral race portion such that the first and second bearing tracks are radially aligned; and inserting a plurality of rolling bearing elements into the first and second bearing tracks.

16. The method as set forth in claim 15, wherein:

said aperture forming step includes:

providing a second machining apparatus having a fixturing portion which precisely retains a workpiece relative to a machining portion of the second machining apparatus; and positioning the disk in the second machining apparatus with the fixturing portion thereof engaging the outer circumferential edge of the disk to removably, yet precisely, retain the disk at a predetermined position and orientation relative to the machining portion of the second machining apparatus.

17. The method as set forth in claim 16, wherein:

said disk forming step includes cutting the disk from an elongate, solid rod of steel.

18. The method as set forth in claim 17, wherein:

said aperture forming step further includes drilling the aperture through the center of the disk while the disk is retained in the fixturing portion of the second machining apparatus.

19. The method as set forth in claim 18, wherein:

said aperture forming step further includes grinding the inside surface of the outer integral race portion while the apertured disk is retained in the fixturing portion of the second machining apparatus.

20. The method as set forth in claim 19, wherein:

said first bearing track forming step comprises grinding the radially inwardly opening groove in the inside surface of the outer integral race portion while the apertured disk is retained in the fixturing portion of the second machining apparatus.

21. The method as set forth in claim 20, wherein:

said first and second track forming steps comprise grinding the first and second bearing tracks for four point contact with the bearing elements to define a radial contact bearing.

* * * * *